(12) United States Patent
Miwa (10) Patent No.: US 9,913,397 B2
(45) Date of Patent: Mar. 6, 2018

(54) DEVICE, CABLE GUIDE DEVICE, AND CABLE HOLDING MEMBER

(71) Applicant: NEC Platforms, Ltd., Kawasaki-shi, Kanagawa (JP)

(72) Inventor: Tomoki Miwa, Kawasaki (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/333,037

(22) Filed: Oct. 24, 2016

(65) Prior Publication Data
US 2017/0118863 A1  Apr. 27, 2017

(30) Foreign Application Priority Data

Oct. 26, 2015  (JP) .................................. 2015-209991

(51) Int. Cl.
*H05K 7/14* (2006.01)
*H02G 3/04* (2006.01)

(52) U.S. Cl.
CPC ......... *H05K 7/1491* (2013.01); *H02G 3/0406* (2013.01); *H05K 7/1489* (2013.01)

(58) Field of Classification Search
CPC .. H05K 7/1491; H05K 7/1489; H05K 7/1492; H05K 7/183
See application file for complete search history.

(56) References Cited

U.S. PATENT DOCUMENTS 6,070,742 A * 6/2000 McAnally ............ H05K 7/1491
 211/26
6,327,139 B1 * 12/2001 Champion ............. H02B 1/202
 174/69

(Continued)

FOREIGN PATENT DOCUMENTS

JP 7-202458 8/1995
JP 2003-152364 5/2003

(Continued)

OTHER PUBLICATIONS

Japanese Office Action dated Sep. 13, 2016, by the Japanese Patent Office in counterpart Japanese Patent Application No. 2015-209991.
Japanese Office Action dated May 16, 2017, by the Japanese Patent Office in counterpart Japanese Patent Application No. 2015-209991.

*Primary Examiner* — Hoa C Nguyen
*Assistant Examiner* — Christopher L Augustin
(74) *Attorney, Agent, or Firm* — Finnegan, Henderson, Farabow, Garrett & Dunner, L.L.P.

(57) ABSTRACT

A device includes a housing supported by a rack in a manner such that the housing is drawable from a front surface of the rack; a cable whose one end is connected to an electronic device contained in the housing, where a portion of the cable in a longitudinal direction thereof is contained between a rear end portion of the housing and a rear surface of the rack; and a cable guide that guides the cable between the rear end portion of the housing and the rear surface of the rack, where the cable guide is unfoldable from a folded state between the rear end portion of the housing and the rear surface of the rack according to a drawing operation of the housing. The cable guide holds the cable at a height which differs from a height of the one end of the cable.

14 Claims, 6 Drawing Sheets

(56) References Cited

U.S. PATENT DOCUMENTS

| | | | | |
|---|---|---|---|---|
| 7,009,112 | B1* | 3/2006 | Mead | H05K 7/1491 |
| | | | | 174/69 |
| 7,258,583 | B1* | 8/2007 | Baiza | H02G 3/0431 |
| | | | | 174/72 A |
| 2002/0092662 | A1* | 7/2002 | Grant | H02G 3/0456 |
| | | | | 174/50 |
| 2004/0090749 | A1* | 5/2004 | McKinnon | H04Q 1/06 |
| | | | | 361/724 |
| 2004/0120134 | A1* | 6/2004 | Nguyen | H02B 1/202 |
| | | | | 361/825 |
| 2005/0145582 | A1* | 7/2005 | Dubon | H02G 3/128 |
| | | | | 211/26 |
| 2007/0017883 | A1* | 1/2007 | Bridges | H05K 7/1491 |
| | | | | 211/26 |
| 2011/0100933 | A1* | 5/2011 | Kitten | F16L 3/015 |
| | | | | 211/1 |
| 2015/0077924 | A1* | 3/2015 | Rauline | H05K 7/1489 |
| | | | | 361/679.39 |
| 2016/0238159 | A1* | 8/2016 | Chang | H05K 7/183 |
| 2016/0309612 | A1* | 10/2016 | Yi | H05K 7/1491 |

FOREIGN PATENT DOCUMENTS

| | | |
|---|---|---|
| JP | 2009-104398 | 5/2009 |
| JP | 2014-197043 | 10/2014 |
| JP | 2015-122407 | 7/2015 |

\* cited by examiner

DEVICE, CABLE GUIDE DEVICE, AND CABLE HOLDING MEMBER

BACKGROUND OF THE INVENTION

Field of the Invention

The present invention relates to a device having a cable guide, a cable guide device, and a cable holding member.

Description of the Related Art

A server device having a plurality of servers contained in a rack is known. For a purpose of maintenance or the like, each server is supported in a manner such that it is slidable and movable in the front to rear direction of the rack so that the server can be pulled forward from the front surface of the rack. In this type of server, various wiring lines for power supply, data communication, and the like, are connected to a rear end portion of the server.

The wiring has an extra length portion, which is laid in a space between the rear surface of the rack and the rear surface of the server so as to prevent an excessive tensile force from applying to the server when the server is pulled forward.

Patent Document 1 discloses a structure in which a foldable cable arm is provided in such a space between the rear surface of the rack and the rear surface of the server, where an extra length portion of the wiring is held along the cable arm. This cable arm is formed by coupling two arms in a foldable manner. In a state in which the server is contained in the rack, the two arms are folded and the wiring is also contained in the space between the rear surface of the rack and the rear surface of the server, in a similar folded manner along the two arms. When the server is pulled forward from the rack, the two arms are unfolded and the wiring is also unfolded in the rack in the front to rear direction.

Here, a connector provided at the end of each of various wiring lines is connected to the rear end portion of the server. Therefore, even in a state in which the server is contained in the rack, the space between the rear surface of the rack and the rear end portion of the server should have a sufficient length in the front to rear direction so as to prevent interference between the connector and an extra length portion of the wiring which is contained in the space in the folded manner.

Patent Document 1: Japanese Unexamined Patent Application, First Publication No. 2015-122407.

However, in a device such as a server device, the effective use of the space in the rack is desired. More specifically, in the rack of a limited size, it is desired to secure the size of each server as large as possible.

SUMMARY OF THE INVENTION

An object of the present invention is to provide a device having a cable guide, a cable guide device, and a cable holding member, by which the space in the rack can be effectively used.

Therefore, the present invention provides a device comprising:

a housing supported by a rack in a manner such that the housing is drawable from a front surface of the rack;

a cable whose one end is connected to an electronic device contained in the housing, where a portion of the cable in a longitudinal direction thereof is contained between a rear end portion of the housing and a rear surface of the rack; and a cable guide that guides the cable between the rear end portion of the housing and the rear surface of the rack, where the cable guide is unfoldable from a folded state between the rear end portion of the housing and the rear surface of the rack according to a drawing operation of the housing, wherein the cable guide holds the cable at a height which differs from a height of the one end of the cable.

The present invention also provides a cable guide device that supports a cable whose one end is connected to an electronic device contained in a housing, where a portion of the cable in a longitudinal direction thereof is contained between a rear end portion of the housing and a rear surface of a rack, the housing is supported by the rack in a manner such that the housing is drawable from a front surface of the rack, and the cable guide device comprises:

a cable holding member that holds the cable in a bent state at a height which differs from a height of the one end of the cable.

The present invention also provides a cable holding member that holds a cable in a bent state, where one end of the cable is connected to an electronic device contained in a housing, a portion of the cable in a longitudinal direction thereof is contained between a rear end portion of the housing and a rear surface of a rack, the housing is supported by the rack in a manner such that the housing is drawable from a front surface of the rack, and the cable holding member comprises:

a first guide surface that is bent at a first radius of curvature; and a second guide surface that is bent at a second radius of curvature which is larger than the first radius of curvature.

In accordance with the present invention, the space on the rear side of the housing in the rack can be reduced, and the space in the rack can be effectively used.

DETAILED DESCRIPTION OF THE INVENTION

Hereinafter, embodiments of the present invention will be described with reference to the appended figures. Here, parts identical to those in the above-described example of Patent Document 1 are given identical names and detailed explanations thereof are omitted.

First Embodiment

Figure 1:
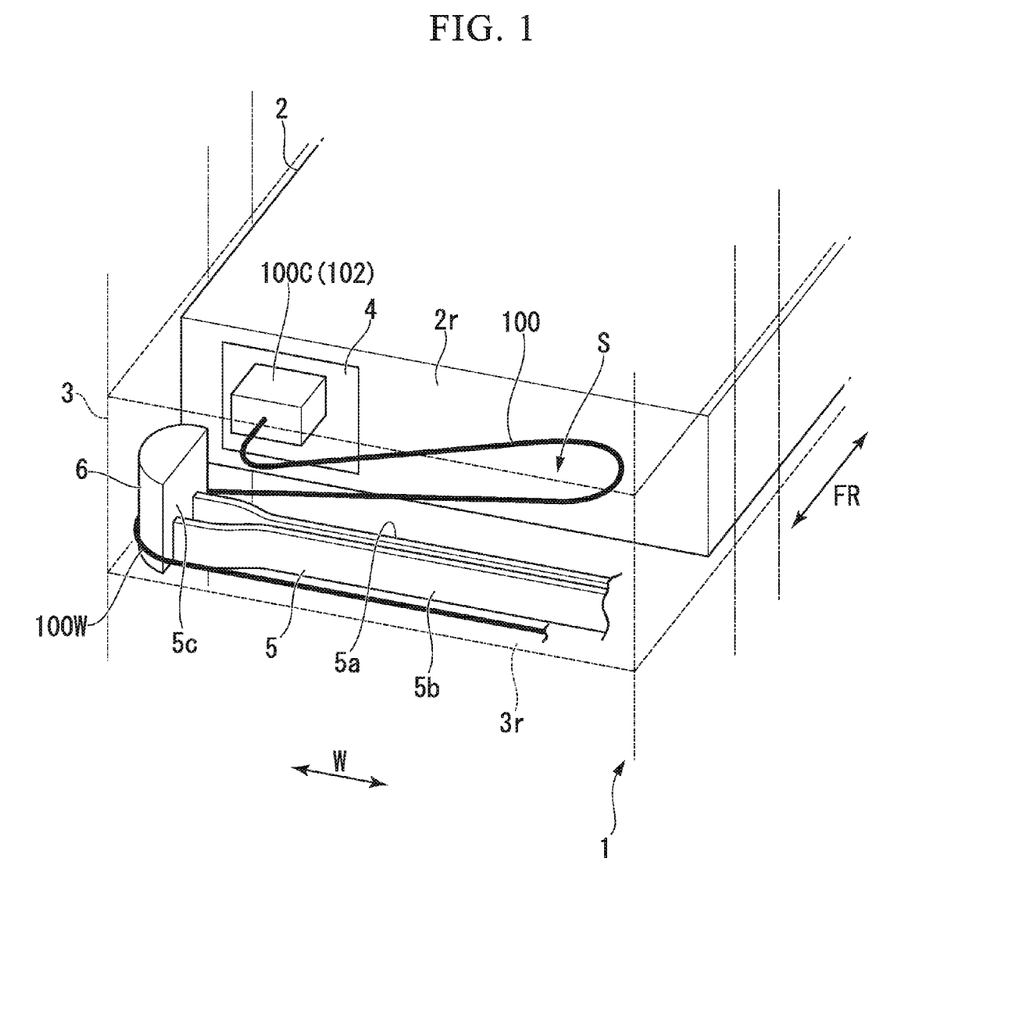
FIG. 1 is a diagram showing a minimum structure of a device according to an embodiment of the present invention.

FIG. 1 is a diagram showing a minimum structure of a device according to the present embodiment.

As shown in FIG. 1, a device 1 has a housing 2, a cable 100, and a cable guide 5 (corresponding to the cable guide device of the present invention).

The housing 2 may have a rectangular form in plan view and contain an electronic device 4. The housing 2 may be contained in a rack 3 having a box shape. In the rack 3, one or more housings 2 of the devices 1 are contained. Each housing 2 is supported by the rack 3 in a slidable and movable manner in a front to rear direction "FR" so that the housing 2 can be pulled forward from the front surface of the rack 3.

In a state in which the housing 2 is contained in the rack 3 without pulling it forward, a space S is formed between a rear end portion 2r of the housing 2 and a rear surface 3r of the rack 3.

At the rear end portion 2r of the housing 2, a connector 102 provided at one end 100c of a cable 100 utilized to electric power supply, data input and output, or the like is connected to the electronic device 4 which is a power supply module, a communication module, or the like.

A portion of the cable 100 in its longitudinal direction is contained in the space S between the rear end portion 2r of the housing 2 and the rear surface 3r of the rack 3.

The cable guide 5 is provided between the rear end portion 2r of the housing 2 and the rear surface 3r of the rack 3. In the cable guide 5, a front arm 5a toward the housing 2 and a rear arm 5b toward the rear surface 3r of the rack 3 are coupled by a coupling part 5c in a freely rotatable manner. The form of the cable guide 5 can be changed from a folded state in which the front arm 5a and the rear arm 5b overlap each other to a V-shaped unfolded state formed by the front arm 5a and the rear arm 5b with the coupling part 5c as a center. In the front arm 5a, an end opposite to the end at the coupling part 5c is connected to the housing 2. In the rear arm 5b, an end opposite to the end at the coupling part 5c is connected to the rear surface 3r of the rack 3. Accordingly, when the housing 2 is slid forward from a state in which the housing 2 is contained in the rack 3, the cable guide 5 is unfolded according to the pull-out operation of the housing 2.

For such a cable guide 5, the cable 100, whose one end 100c is connected to the electronic device 4 at the rear end portion 2r of the housing 2, is arranged along the front arm 5a and the rear arm 5b of the cable guide 5. The cable 100 is held by a cable holding member 6, which is provided at the coupling part 5c that couples the front arm 5a and the rear arm 5b, in a bent state.

The coupling part 5c of the cable guide 5 is arranged on a first side in the width direction W of the housing 2. Among the cables 100 connected to the electronic device 4, an end 100c of the cable 100 connected to a power supply module to supply electric power is arranged on the same side as that of the coupling part 5c in the width direction W.

The cable holding member 6 holds a cable bent part 100w in the bent state at a height different from the height of the end 100c of the cable 100 connected to the electronic device 4 at the rear end portion 2r of the housing 2.

In this device 1, in a state in which the housing 2 is contained in the rack 3 and the cable guide 5 is folded, the cable holding member 6 is positioned close to the end 100c of the cable 100. Since the height of the end 100c of the cable 100 connected to the housing 2 differs from the height of the cable bent part 100w held by the cable holding member 6 of the cable guide 5, it is possible to prevent interference between the end 100c of the cable 100 and the cable bent part 100w. Accordingly, the cable guide 5 and the cable holding member 6 can be arranged close to the rear end portion 2r of the housing 2. Therefore, the space S on the rear side of the housing 2 in the rack 3 can be reduced, and the size of the housing 2 in the front to rear direction can be increased. As a result, the space in the rack 3 can be effectively used.

Second Embodiment

Figure 2:
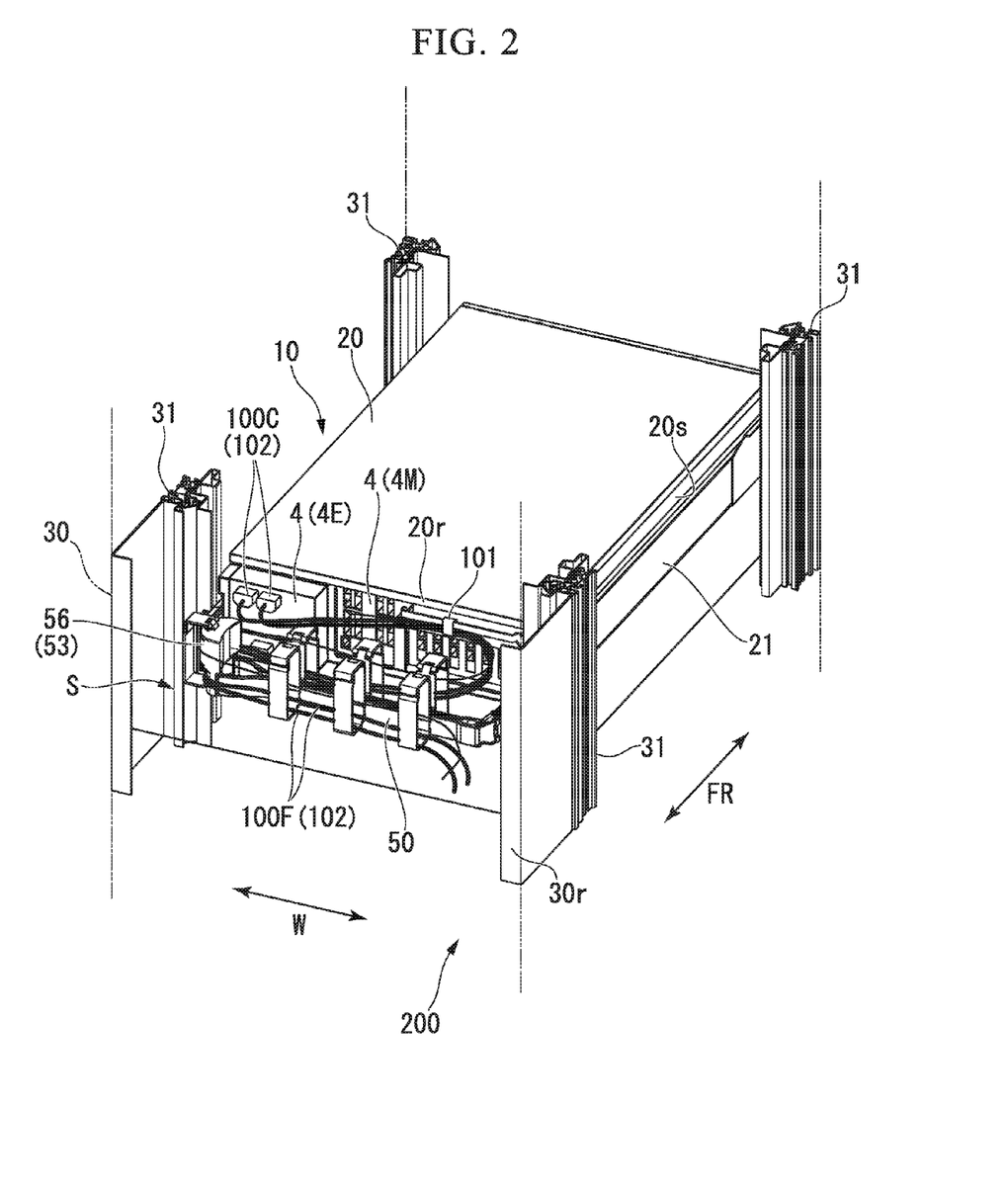
FIG. 2 is a perspective view showing a server device as the device having a cable guide, according to an embodiment of the present invention.
Figure 3:
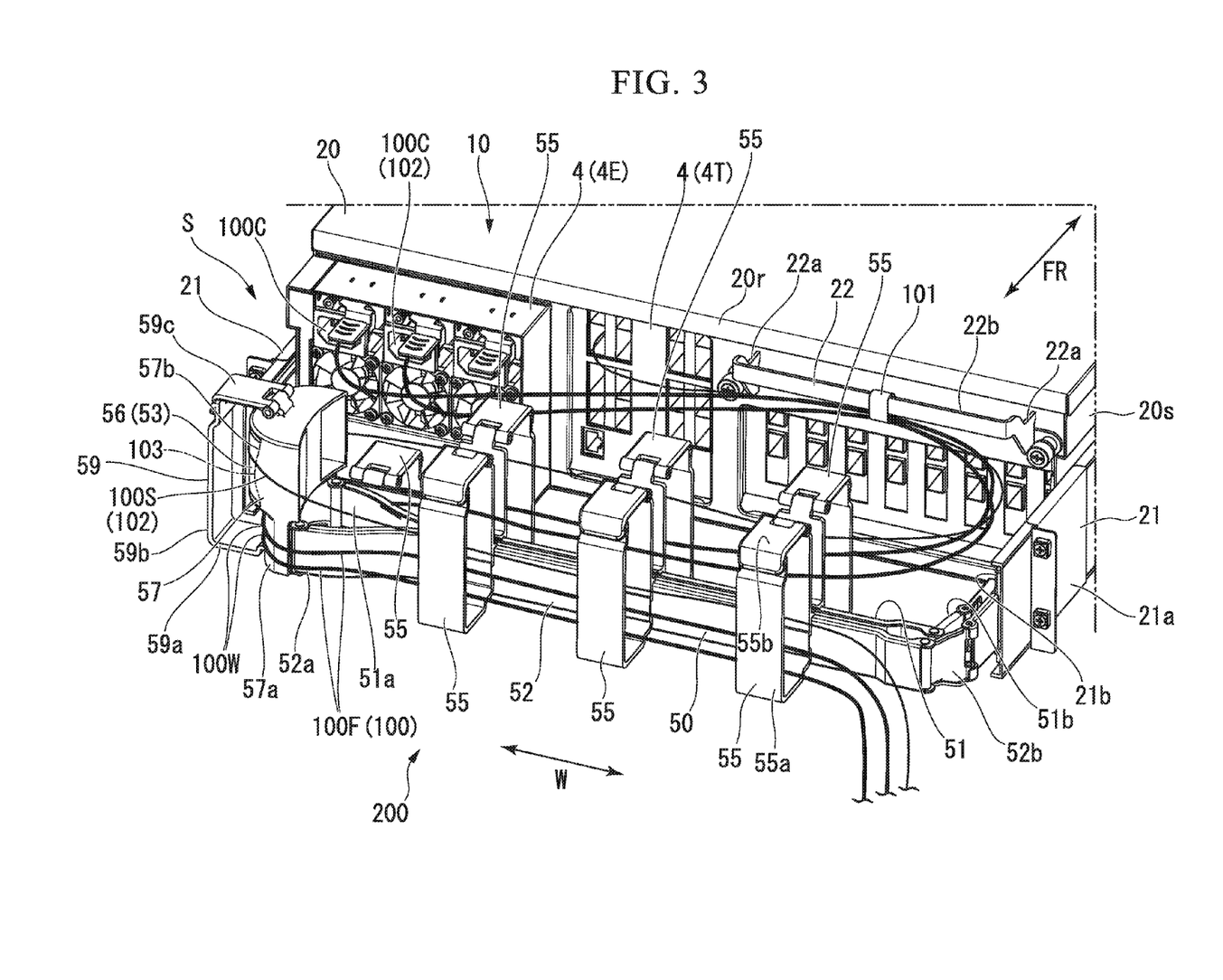
FIG. 3 is a view of a server observed from an oblique rear side thereof.
Figure 4:
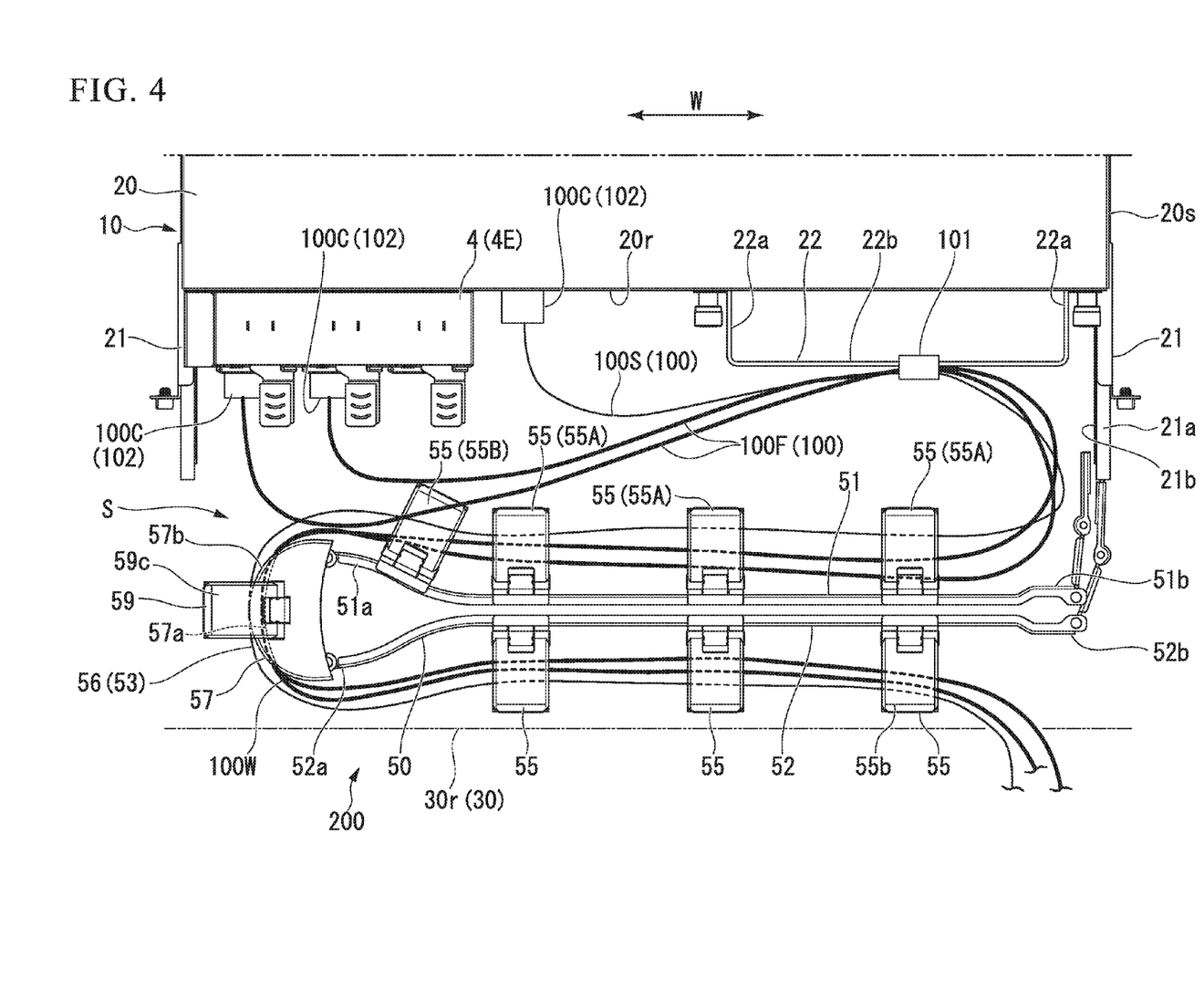
FIG. 4 is a plan view of a rear end portion of the server.
Figure 5:
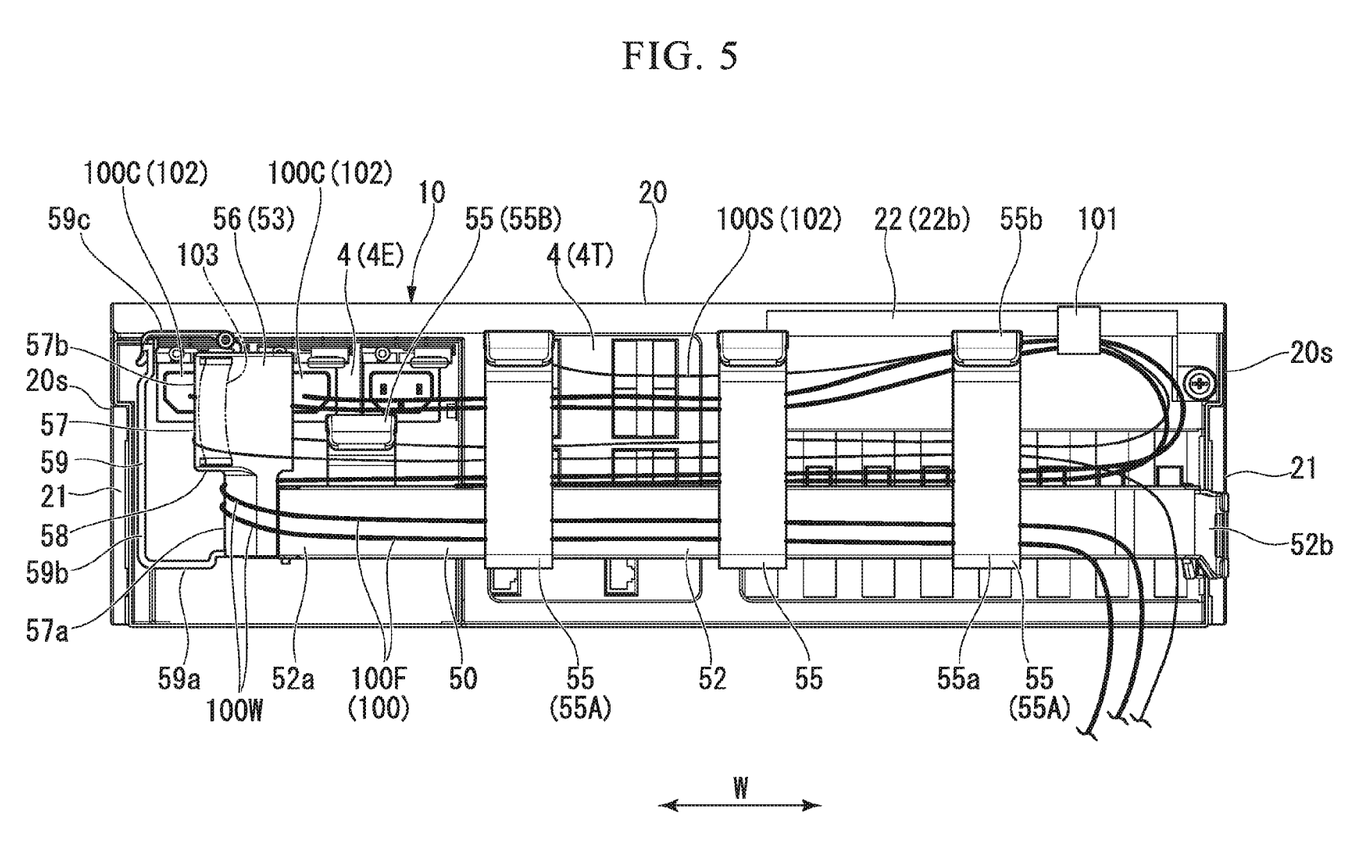
FIG. 5 is a rear view of the rear end portion of the server.
Figure 6:
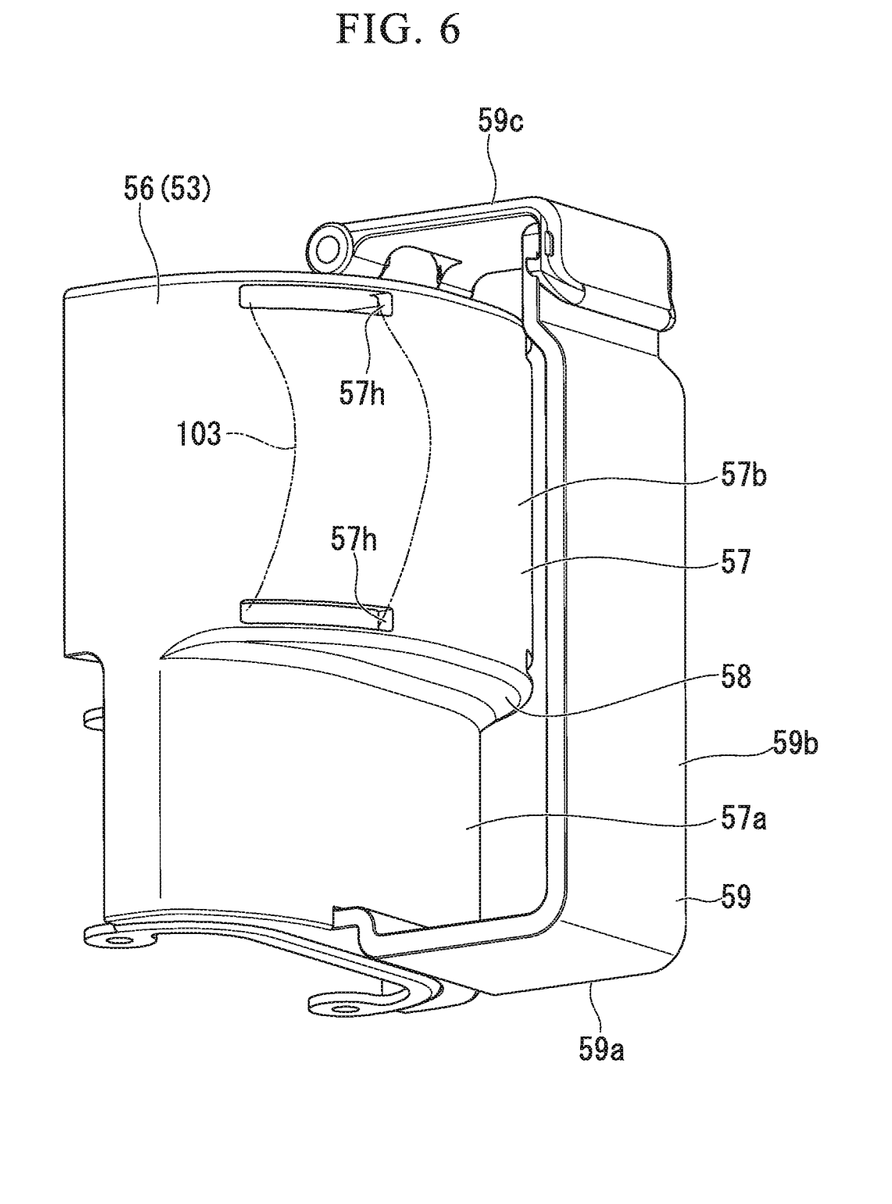
FIG. 6 is a perspective view of a cable holding member.

FIG. 2 is a perspective view showing a server device as the device having a cable guide, according to the present embodiment. FIG. 3 is a view of a server observed from an oblique rear side thereof. FIG. 4 is a plan view of a rear end portion of the server. FIG. 5 is a rear view of the rear end portion of the server. FIG. 6 is a perspective view of a cable holding member.

As shown in FIG. 2, the server device 200 (corresponding to the device of the present invention) includes a server 10 having a housing 20, cables 100, and a cable guide 50 (corresponding to the cable guide device of the present invention).

In the server 10, a plurality of electronic devices 4 are contained in the housing 20 having a rectangular shape in plan view. The electronic devices 4 may be a server module that has a CPU (Central Processing Unit) and storage devices such as a memory; a fan module that generates wind utilized to cool the server module; a power supply module that supplies electric power to the server module, the fan module, and the like, a communication module that performs data input and output operation between the server module and an external device, and the like.

In an example, the housing 20 of the server 10 is contained in a box-shaped rack 30 which has a rectangular shape in plan view. The rack 30 has support poles 31 extending vertically at four corners of the rack 4. In the rack 30, the housings 20 of a plurality of the servers 10 are contained at intervals from one another in the vertical direction. Here, the longitudinal direction of the server 10 having a rectangular form in plan view is defined to be a front to rear direction FR, and the short-side direction of the server 10 is defined to be a width direction W.

As shown in FIGS. 3 and 4, guide rails 21 are provided on both sides of each housing 20 in the width direction W. Each guide rail 21 has (i) a fixed rail 21a which is fastened to the support poles 31 separately arranged in the front to rear direction FR and thus extends in the front to rear direction FR, and (ii) a moving rail 21b which is supported in a freely slidable and movable manner along the fixed rail 21a. The moving rail 21b is fastened to a side surface 20s of the housing 20. Accordingly, the housing 20 is supported along the guide rail 21 in a slidable manner in the front to rear direction FR so that the housing 20 can be pulled forward from the front surface of the rack 30.

In a state in which the housing 20 is contained in the rack 30 without pulling it forward, a space S is formed between a rear end portion 20r of the housing 20 and a rear surface 30r of the rack 30.

As shown in FIGS. 3 to 5, in the rear end portion 20r of the housing 20, one end 100c of each of various cables 100 is connected to the corresponding electronic device 4 by using a connector 102. The electronic device 4 to which the cable 100 is connected may be a power supply module 4E or a communication module 4T. Cables 100 utilized to supply (electric) power are connected to the power supply module 4E, and a cable 100 utilized to data input and output operation is connected to the communication module 4T.

Here, the outer diameter of the cable 100 for the data input and output operation is smaller than that of each cable 100 for the power supply. In the following explanation, the cable 100 for the data input and output operation is called a "small-diameter cable 100S" while each cable 100 for the power supply is called a "large-diameter cable 100F"

In the housing 20, the power supply module 4E is arranged on a first side in the width direction W. In the rear end portion 20r of the housing 20, the connector provided at one end 100c of each large-diameter cable 100F is connected to an upper part of the first side in the width direction W.

In the large-diameter cables 100F and the small-diameter cable 100S, a portion in the longitudinal direction thereof is contained in the space S between the rear end portion 20r of the housing 20 and the rear surface 30r of the rack 30

In the rear end portion 20r of the housing 20, a cable binding part 22 is provided in an upper part of the second side in the width direction W. The cable binding part 22 has (i) a pair of support parts 22a which protrude rearward from the rear end portion 20r of the housing 20, and (ii) a horizontal rod 22b which is bridged between the support parts 22a and extends in the width direction W, where these members are integrally formed.

The cable guide 50 is provided between the rear end portion 20r of the housing 20 and the rear surface 30r of the rack 30. In the cable guide 50, a first end 51a of a front arm 51 toward the housing 20 and a first end 52a of a rear arm 52 toward the rear surface 30r of the rack 30 are coupled by a coupling part 53 in a freely rotatable manner.

A second end 51b of the front arm 51 (i.e., on the side opposite to the coupling part 53) is coupled in a freely rotatable manner to the moving rail 21b of the guide rail 21 provided at the housing 20. A second end 52b of the rear arm 52 (i.e., on the side opposite to the coupling part 53) is coupled in a freely rotatable manner to the fixed rail 21a of the guide rail 21 on the rear surface 30r side of the rack 30.

The form of the cable guide 50 can be changed from a folded state in which the front arm 51 and the rear arm 52 overlap each other to a V-shaped unfolded state in which the second end 51b of the front arm 51 and the second end 52b of the rear arm 52 are separated from each other in the front to rear direction FR with the coupling part 53 as a center. Accordingly, when the housing 20 is slid forward from a state in which the housing 20 is contained in the rack 30, the cable guide 50 is unfolded in the front-to-back direction according to the pull-out operation of the housing 20.

Here, the coupling part 53 of the cable guide 50 is arranged on the first side in the width direction W.

At each of the front arm 51 and the rear arm 52 of the cable guide 50, a plurality of cable hooks 55 are provided at specific intervals in the width direction W. Each cable hook 55 has (i) a U-shaped hook main body 55a that is fastened to the font arm 51 or the rear arm 52 and opens upward, and (ii) a cap body 55b utilized to open or close the upper opening of the hook main body 55a. The cable hooks 55 have two types of a first cable hook 55A and a second cable hook 55B whose heights differ from each other. Between these types, the second cable hook 55B whose height in the vertical direction is lower than that of the first cable hook 55A is arranged on the front arm 51 and closest to the coupling part 53 and is fastened to a lower portion of the front arm 51.

In the cable guide 50, a cable holding member 56 utilized to support the large-diameter cables 100F and the small-diameter cable 100S in a bent state is provided at the coupling part 53 of the front arm 51 and the rear arm 52.

As shown in FIG. 6, the cable holding member 56 has a guide surface 57 which protrudes from the first side in the width direction W. The guide surface 57 has (i) a first guide surface 57a formed in the lower half and bent at a first radius of curvature r1 and (ii) a second guide surface 57b formed in the upper half and bent at a second radius of curvature r2.

Here, the second guide surface 57b is formed with the second radius of curvature r2 which is larger than the first radius of curvature r1 and greater than or equal to the minimum radius of curvature for optical fibers.

Additionally, in comparison with the second guide surface 57b, the first guide surface 57a is positioned more inside in the radial direction, that is, closer to the second side in the width direction W so that a step 58 is formed in a horizontal surface along a radial direction between the first guide surface 57a and the second guide surface 57b.

At upper and lower end portions of the second guide surface 57b, insertion holes 57h are formed so as to insert, for example, a fixing belt 103 utilized to fix the cable 100.

The cable holding member 56 also has a support member 59 which faces the guide surface 57. The support member 59 has (i) a bottom support part 59a which extends outward from the lower end of the guide surface 57 in the radial direction of the guide surface 57, (ii) a side support part 59b which extends upward from the bottom support part 59a and faces the guide surface 57 with an interval between the side support part 59b and the guide surface 57, and (iii) a cap part 59c which openably closes a part between an upper end portion of the side support part 59b and an upper end portion of the guide surface 57.

As shown in FIGS. 3 to 5, the large-diameter cables 100F and the small-diameter cable 100S, whose one ends 100c are connected to the corresponding electronic devices 4 at the rear end portion 20r of the housing 20, are guided to the second side in the width direction W and are collectively bound at the horizontal rod 22b of the cable binding part 22 by using a binding tool 101 (e.g., a binding belt). From the bound part using the binding tool 101, the large-diameter cables 100F and the small-diameter cable 100S are bent and turned to the first side in the width direction W.

The turned large-diameter cables 100F and small-diameter cable 100S are arranged along the front arm 51 of the cable guide 50 from the second end 51b to the first end 51a and caught in the hook main bodies 55a of the relevant hooks 55. In the front arm 51, the second cable hook 55B arranged closest to the coupling part 53 caught only the large-diameter cables 100F so that the large-diameter cables 100F are bound at the lower side, the small-diameter cable 100S passes above the second cable hook 55B, and the cables are guided to the cable holding member 56.

At the cable holding member 56, the large-diameter cables 100F and the small-diameter cable 100S are guided along the guide surface 57 so as to be turned to the second side in the width direction W. Here, the large-diameter cables 100F are bent along the first guide surface 57a at the lower side of the guide surface 57 while the small-diameter cable 100S is bent along the second guide surface 57b at the upper side of the guide surface 57 and is fixed by using the fixing belt 103.

The cable holding member 56 holds a cable bent part 100w of the large-diameter cables 100F in the bent state at a height different from the height of the end 100c of each cable 100 connected to the corresponding electronic device 4 at the rear end portion 20r of the housing 20. More specifically, the cable bent part 100w of the large-diameter cables 100F held by the cable holding member 56 is positioned lower than the end 100c of each cable 100 connected to the electronic device 4.

The large-diameter cables 100F and the small-diameter cable 100S, which are held in the bent state by the cable holding member 56, are arranged along the rear arm 52 from the first end 52a to the second end 52b and caught in the hook main bodies 55a of the relevant hooks 55.

In the cable holding member 56, in comparison with the second guide surface 57b, the first guide surface 57a is positioned more inside in the radial direction, that is, closer to the second side in the width direction W. Therefore, in comparison with the second guide surface 57b, there is a larger space between the first guide surface 57a and the side support part 59b of the support member 59 so that a greater number of large-diameter cables 100F can be laid in the space between the first guide surface 57a and the side support part 59b.

In addition, the step 58 is formed in a horizontal surface along a radial direction between the first guide surface 57a and the second guide surface 57b. Therefore, it is possible to prevent each large-diameter cable 100F from shifting upward and entering a range where the small-diameter cable 100S is caught.

In addition, the second guide surface 57b is formed with the second radius of curvature r2 which is larger than the first radius of curvature r1 of the first guide surface 57a and greater than or equal to the minimum radius of curvature for optical fibers. Therefore, the radius of curvature of the small-diameter cable 100S can always be greater than or equal to the minimum radius of curvature for optical fibers.

In the server device 200 as described above, in a state in which the housing 20 is contained in the rack 30 and the front arm 51 and the rear arm 52 are folded, the height of one end 100c of each cable 100 connected to the housing 20 differs from the height of the cable 100 held by the cable guide 50. Therefore, it is possible to prevent interference between the end 100c of the cable 100 and the cable 100 held by the cable guide 50. Accordingly, the cable guide 50 can be arranged close to the rear end portion 20r of the housing 20. As a result, the space S on the rear side of the housing 20 in the rack 30 can be reduced, and the size of the housing 20 in the front to rear direction can be increased. Therefore, the space in the rack 30 can be effectively used, for example, the size of the housing 20 contained in the rack 30 is increased.

In addition, the cable guide 50 has the cable holding member 56 which holds the cable bent part 100w in the bent state at a height different from the height of the end 100c of each cable 100. Accordingly, it is possible to prevent interference between the end 100c of the cable 100 and the cable bent part 100w. As a result, the cable guide 50 and the cable holding member 56 can be arranged close to the rear end portion 20r of the housing 20.

The server device 200 further has the small-diameter cable 100S, whose one end 100c is connected to the corresponding electronic device 4 contained in the housing 20. A portion of the small-diameter cable 100S in the longitudinal direction thereof is contained between the rear end portion 20r of the housing 20 and the rear surface 30r of the rack 30, and the outer diameter of the small-diameter cable 100S is smaller than that of the large-diameter cables 100F. The small-diameter cable 100S is held by the cable holding member 56 at a height which differs from the height where the large-diameter cables 100F are held.

Since the large-diameter cables 100F and the small-diameter cable 100S are held at different heights, the large-diameter cables 100F and the small-diameter cable 100S can be arranged in different manners. Accordingly, the large-diameter cables 100F and the small-diameter cable 100S can be routed neatly and can also be easily and reliably managed.

In the server device 200, the cable holding member 56 has the first guide surface 57a which guides the large-diameter cables 100F and is bent at the first radius of curvature r1 and the second guide surface 57b which guides the small-diameter cable 100S and is bent at the second radius of curvature r2 which is larger than the first radius of curvature r1 of the first guide surface 57a.

Since the first guide surface 57a for the large-diameter cables 100F utilized to supply power and the second guide surface 57b for the small-diameter cable 100S formed by using optical fibers have different radii of curvature, the minimum radius of curvature for the small-diameter cable 100S formed by using optical fibers can be secured.

Additionally, in the server device 200, in comparison with the second guide surface 57b, the first guide surface 57a is positioned more inside in the radial direction. Therefore, the distance between the first guide surface 57a and the side support part 59b of the support member 59 is longer than the distance between the second guide surface 57b and the side support part 59b. Therefore, a greater number of large-diameter cables 100F can be laid in the space between the first guide surface 57a and the side support part 59b, which improves the storage efficiency of the large-diameter cables 100F.

In addition, in the server device 200, the step 58 is formed along a radial direction between the first guide surface 57a and the second guide surface 57b. Therefore, it is possible to prevent each large-diameter cable 100F from shifting upward and entering a range where the small-diameter cable 100S is caught.

Furthermore, at the cable holding member 56 of the server device 200, the large-diameter cables 100F are arranged lower than the small-diameter cable 100S.

In comparison with the small-diameter cable 100S consisting of optical fibers for the data input and output operation, the replacement frequency of the large-diameter cables 100F for the power supply is low. Since the large-diameter cables 100F having a low replacement frequency are arranged lower than the small-diameter cable 100S, replacement of the small-diameter cable 100S or the like can be easily performed without being obstructed by the large-diameter cables 100F.

Additionally, in the server device 200, the cable guide 50 guides the large-diameter cables 100F and the small-diameter cable 100S to the cable holding member 56 at different heights on the rear end portion 20r side of the housing 20.

Accordingly, it is possible to distinguishably guide the large-diameter cables 100F and the small-diameter cable 100S to the cable holding member 56 from the rear end portion 20r side of the housing 20.

In addition, the cable guide 50 in the server device 200 has the first cable hooks 55A and the second cable hook 55B whose height is smaller than that of the first cable hooks 55A, where the second cable hook 55B is positioned closer to the cable holding member 56 than the first cable hooks 55A.

Accordingly, the large-diameter cables 100F and the small-diameter cable 100S can be collectively bound at each first cable hook 55A which is higher than the second cable hook 55B while the lower second cable hook 55B can collectively hold only the large-diameter cables 100F. Therefore, the large-diameter cables 100F can be collectively guided to the first guide surface 57a of the cable holding member 56 and thus the cable routing can be efficiently performed.

In addition, in the server device 200, the height of the second cable hook 55B, which holds the large-diameter cables 100F, differs from the height of the end 100c of each large-diameter cable 100F. Accordingly, it is possible to reliably prevent interference between the large-diameter cables 100F and the end 100c of each large-diameter cable 100F.

The cable guide 50 supports each large-diameter cable 100F whose one end 100c is connected to an electronic device 4 contained in the housing 20 that is supported by the rack 30 in a manner such that the housing 20 can be pulled forward from the front surface of the rack 30, where a portion of the large-diameter cable 100F in the longitudinal direction thereof is contained between the rear end portion 20r of the housing 20 and the rear surface 30r of the rack 30. This cable guide 50 has the cable holding member 56 which holds the large-diameter cable 100F in a bent state at a height which differs from the height of the end 100c of the large-diameter cable 100F.

Therefore, the height of the part (of the large-diameter cable 100F) connected to the housing 20 differs from the height of the cable bent part 100w held by the cable guide 50, and thus it is possible to prevent interference within the large-diameter cable 100F.

The above cable holding member 56 holds each large-diameter cable 100F in a bent state, whose one end 100c is connected to an electronic device 4 contained in the housing 20 that is supported by the rack 30 in a manner such that the housing 20 can be pulled forward from the front surface of the rack 30, where a portion of the large-diameter cable 100F in the longitudinal direction thereof is contained between the rear end portion 20r of the housing 20 and the rear surface 30r of the rack 30. This cable holding member 56 has the first guide surface 57a bent at the first radius of curvature and the second guide surface 57b bent at the second radius of curvature larger than the first radius of curvature.

According to the cable holding member 56, it is possible to prevent interference between the end 100c of the relevant cable 100 and the cable bent part 100w. Therefore, the cable guide 50 and its cable holding member 56 can be arranged close to the rear end portion 20r of the housing 20. As a result, the space S on the rear side of the housing 20 in the rack 30 can be reduced while the size of the housing 20 in the front to rear direction can be increased. Therefore, the space in the rack 30 can be effectively used.

In the above embodiments, the type or number of the cables contained in the space S on the rear side of the housing 2 or 20 is not limited. In addition, for the large-diameter cables 100F, one end 100c connected to the electronic device 4 has a height which differs from the height of the cable bent part 100w held by the cable holding member 56 in a bent state. However, a similar manner may be applied to the small-diameter cable 100S, that is, one end 100c connected to the electronic device 4 has a height which differs from the height of the cable bent part 100w held by the cable holding member 56 in a bent state.

In the above cable holding member 56, the large-diameter cables 100F and the small-diameter cable 100S are respectively arranged as a lower part and an upper part. However, any division manner may be employed.

Additionally, in the device 1 or the server device 200, the type or number of the electronic devices 4 contained in the housing 2 or 20 is not limited.

In addition, the structure of supporting the housing 2 or 20 in the rack 3 or 30 in a freely slidable and movable manner in the front to rear direction FR or the structure of the cable guide 5 or 50 which is unfolded according to the pull-out operation of the housing 2 or 20 is also replaced with any other structure if required functions are implemented.

Furthermore, as the device (having a cable guide) of the present invention, the above second embodiment employs the server device 200 having a CPU or the like. However, this is not a limiting condition. As such a device, the present invention can be applied even to various types of devices in which a CPU or the like is not provided in the housing 20.

Other than the above, additions, omissions, substitutions, and modifications can be made without departing from the scope of the present invention. Accordingly, the invention is not to be considered as being limited by the foregoing description, and is only limited by the scope of the appended claims.

Priority is claimed on Japanese Patent Application No. 2015-209991, filed Oct. 26, 2015, the contents of which are incorporated herein by reference.

What is claimed is:

1. A device comprising:
   a housing supported by a rack in a manner such that the housing is drawable from a front surface of the rack;
   a cable whose one end is connected to an electronic device contained in the housing, where a portion of the cable in a longitudinal direction thereof is contained between a rear end portion of the housing and a rear surface of the rack; and
   a cable guide that guides the cable between the rear end portion of the housing and the rear surface of the rack, where the cable guide is unfoldable from a folded state between the rear end portion of the housing and the rear surface of the rack according to a drawing operation of the housing,
   wherein the cable guide holds the cable at a height which differs from a height of the one end of the cable,
   wherein a cable holding member is provided in the cable guide and holds the cable in a bent state, the cable holding member comprising:
      a first guide surface that guides a large-diameter cable, the first guide surface having a first radius of curvature; and
      a second guide surface that guides a small-diameter cable having an outer diameter smaller than an outer diameter of the large-diameter cable, the second guide surface having a second radius of curvature different from the first radius of curvature, the second guide surface being arranged above the first guide surface.

2. The device in accordance with claim 1, wherein the cable guide has a cable holding member that holds the cable in a bent state at the height which differs from the height of the one end of the cable.

3. The device in accordance with claim 2, further comprising:
   the small-diameter cable, where one end of the small-diameter cable is connected to an electronic device contained in the housing, and a portion of the small-diameter cable in a longitudinal direction thereof is contained between the rear end portion of the housing and the rear surface of the rack,
   wherein the small-diameter cable is held by the cable holding member at a height that differs from the height of the large-diameter cable held by the cable holding member.

4. The device in accordance with claim 3, wherein the cable holding member has:
   the first guide surface that guides the large-diameter cable and is bent at a first radius of curvature; and
   the second guide surface that guides the small-diameter cable and is bent at a second radius of curvature which is larger than the first radius of curvature.

5. The device in accordance with claim 4, wherein the first guide surface is arranged more inside in a radial direction than the second guide surface.

6. The device in accordance with claim 4, wherein a step is formed along a radial direction between the first guide surface and the second guide surface.

7. The device in accordance with claim 3, wherein at the cable holding member, the large-diameter cable is arranged lower than the small-diameter cable.

8. The device in accordance with claim 3, wherein the cable guide guides the large-diameter cable and the small-diameter cable to the cable holding member at different heights on the rear end portion side of the housing.

9. The device in accordance with claim 2, wherein:
the cable guide comprises:
a first cable holding tool, and
a second cable holding tool whose height is smaller than that of the first cable holding tool; and
the second cable holding tool is arranged to have a height which differs from that of said one end of the cable, so as to hold the cable.

10. The device in accordance with claim 3, wherein:
the cable guide comprises:
a first cable holding tool, and
a second cable holding tool whose height is smaller than that of the first cable holding tool; and
the second cable holding tool is arranged to have a height which differs from that of said one end of the large-diameter cable, so as to hold the large-diameter cable.

11. The device in accordance with claim 9, wherein the second cable holding tool is positioned closer to the cable holding member than the first cable holding tool.

12. The device in accordance with claim 10, wherein the second cable holding tool is positioned closer to the cable holding member than the first cable holding tool.

13. A cable guide device that supports a cable whose one end is connected to an electronic device contained in a housing, where a portion of the cable in a longitudinal direction thereof is contained between a rear end portion of the housing and a rear surface of a rack, the housing is supported by the rack in a manner such that the housing is drawable from a front surface of the rack, and the cable guide device comprises:
a cable holding member that holds the cable in a bent state at a height which differs from a height of the one end of the cable,
wherein the cable holding member comprises:
a first guide surface that guides a large-diameter cable, the first guide surface having a first radius of curvature; and
a second guide surface that guides a small-diameter cable having an outer diameter smaller than an outer diameter of the large-diameter cable, the second guide surface having a second radius of curvature different from the first radius of curvature, the second guide surface being arranged above the first guide surface.

14. A cable holding member that holds a cable in a bent state, where one end of the cable is connected to an electronic device contained in a housing, a portion of the cable in a longitudinal direction thereof is contained between a rear end portion of the housing and a rear surface of a rack, the housing is supported by the rack in a manner such that the housing is drawable from a front surface of the rack, and the cable holding member comprises:
a first guide surface that guides a large-diameter cable, the first guide surface having a first radius of curvature; and
a second guide surface that guides a small-diameter cable having an outer diameter smaller than an outer diameter of the large-diameter cable, the second guide surface having a second radius of curvature different from the first radius of curvature, the second guide surface being arranged above the first guide surface.

* * * * *